United States Patent [19]

Dvorsky et al.

[11] Patent Number: 5,894,651
[45] Date of Patent: Apr. 20, 1999

[54] METHOD FOR ENCAPSULATING A CERAMIC DEVICE FOR EMBEDDING IN COMPOSITE STRUCTURES

[75] Inventors: George Raymond Dvorsky, Manhattan Beach; David Wayne Love, Lakewood, both of Calif.

[73] Assignee: TRW Inc., Redondo Beach, Calif.

[21] Appl. No.: 08/172,666

[22] Filed: Dec. 23, 1993

Related U.S. Application Data

[62] Division of application No. 07/604,306, Oct. 29, 1990, Pat. No. 5,305,507.

[51] Int. Cl.⁶ .................................................... H01L 41/08
[52] U.S. Cl. ........................................... 310/344; 310/340
[58] Field of Search ........................... 310/340, 344, 310/346

[56] References Cited

U.S. PATENT DOCUMENTS

| | | | |
|---|---|---|---|
| 3,167,668 | 1/1965 | Nesh | 310/340 |
| 3,594,514 | 7/1971 | Wingrove | 179/107 R |
| 3,659,615 | 5/1972 | Enger | 128/419 P |
| 3,711,617 | 1/1973 | Evans | 84/1.01 |
| 4,017,752 | 4/1977 | Kakehi et al. | 310/340 |
| 4,649,312 | 3/1987 | Robin et al. | 310/330 |
| 4,807,294 | 2/1989 | Iwata et al. | 381/190 |
| 4,849,668 | 7/1989 | Crawley et al. | 310/328 |
| 4,876,776 | 10/1989 | Whatmore et al. | 29/25.35 |
| 5,220,538 | 6/1993 | Flanagan et al. | 367/157 |

FOREIGN PATENT DOCUMENTS

| | | | |
|---|---|---|---|
| 0097716 | 6/1982 | Japan | 310/344 |
| 0094911 | 5/1984 | Japan | 310/344 |
| 0165421 | 7/1987 | Japan | 310/340 |
| 0641959 | 8/1950 | United Kingdom | 310/340 |
| 0677947 | 8/1952 | United Kingdom | 310/340 |

*Primary Examiner*—Thomas M. Dougherty
*Attorney, Agent, or Firm*—Michael S. Yatsko

[57] ABSTRACT

A piezoelectric actuator/sensor package and corresponding method for its fabrication, and a method of embedding a ceramic actuator/sensor in a laminated structural member, such as a graphite-epoxy laminate. A ceramic actuator/sensor, with lead wires first bonded to it, is encapsulated in a non-conductive fiber composite material, such as fiberglass cloth and epoxy, to form a package that is precured at a suitable temperature, typically room temperature. Encapsulation provides electrical insulation, good strain coupling, protection from mechanical damage, and reduction in thermal stresses, since the coefficient of thermal expansion of the encapsulating material is selected to be between those of the ceramic and the graphite-epoxy laminate. Graphite fibers may be added to the package to enhance voltage-strain performance. The package is embedded in the structural laminate and the composite structure is cured in a manner that minimizes thermally-induced stresses. Piezoelectric prestressing, during the embedment step, may be used to further reduce the effects of thermal stresses.

9 Claims, 1 Drawing Sheet

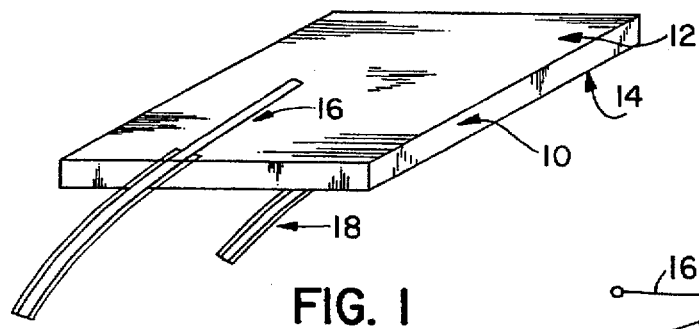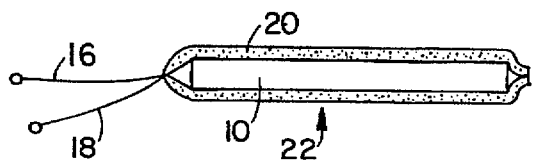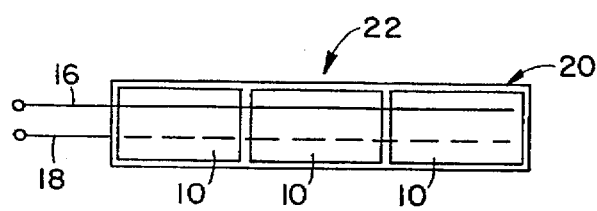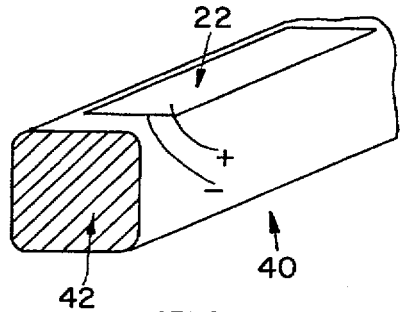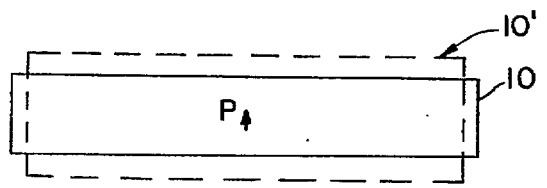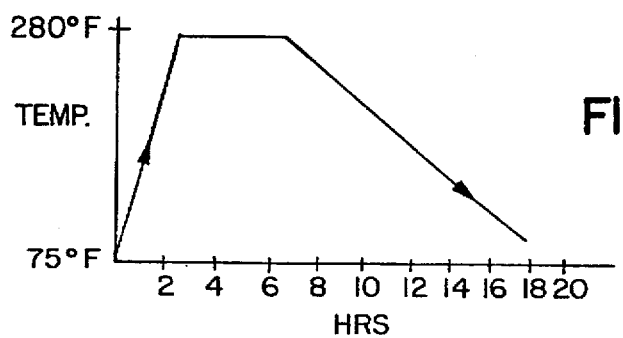

METHOD FOR ENCAPSULATING A CERAMIC DEVICE FOR EMBEDDING IN COMPOSITE STRUCTURES

This is a divisional of application Ser. No. 07/604,306, filed Oct. 29, 1990 now U.S. Pat. No. 5,305,507.

BACKGROUND OF THE INVENTION

This invention relates generally to piezoelectric actuators and sensors for use in composite structures of various types, and, more particularly, to techniques for embedding actuators and sensors in composite structures. Structures used in aerospace applications usually have to be stiff, light in weight, and able to dissipate mechanical energy in the form of vibration. Various techniques have been proposed for the dissipation of energy, and these may be categorized as active or passive approaches.

Passive energy dissipation typically uses layers of viscoelastic materials, either embedded in structural members or applied at structurally joints. Viscoelastic materials have the useful property that their stiffness increases with the rate at which they are mechanically stressed. Therefore, a viscoelastic member is subject to relatively high damping forces when vibrating rapidly, and lower damping forces when deformed more slowly. Although significant levels of damping can be obtained by passive means, static strength is reduced by the presence of the viscoelastic materials, since structural members must be reduced in stiffness at certain locations in order to introduce energy into the viscoelastic material. Also, since the properties of viscoelastic materials are highly temperature dependent, a thermal control system must be used in space structures, to maintain them at the desired operating conditions. This is costly in terms of both power consumption and weight, and in some cases thermal control is not possible at all.

The active damping approach employs actuators, which, operating in conjunction with deformation sensors, apply damping forces to compensate for vibrational and other loading forces on structures. Static structural strength and stiffness are not compromised by active damping, and many ceramic actuator materials can retain their properties over a much larger temperature range than passive damping structures. In many cases thermal control systems are not needed if active damping is used.

The principal difficulty with actively damped structures is that of embedding ceramic actuators in composite materials. The most efficient actuator materials are piezoelectric ceramics, such as lead zirconate titanate (PZT), and electrostrictive ceramics, such as lead molybdenum niobate (PMN). Piezoelectric materials can be used as actuators, since a voltage applied to them causes structural deformation in a selected direction, or as sensors, whereby a deformation in a selected direction induces a measurable voltage. Unfortunately, most ceramic materials are relatively brittle and have a large positive coefficient of thermal expansion (CTE). Graphite fiber-reinforced epoxies have a zero or slightly negative CTE. When a graphite fiber reinforced epoxy is cured at elevated temperatures, and subsequently cooled, tensile stresses are induced in the embedded ceramic materials. Resultant cracking will degrade ceramic actuator performance significantly, if not totally. Another difficulty is the need to insulate actuators electrically from conductive graphite fibers in the composite materials in which the actuators are embedded. Ceramic actuators and sensors have two electroplated surfaces with attached connecting leads that must be insulated. Yet another problem is the inherent fragility of the actuators, which may lead to breakage even prior to embedment in a composite structure.

One proposed solution to these problems was to encase an actuator or sensor in a Kapton envelope before embedding it in a structure. The principal drawback of this solution is that the Kapton and the associated adhesive material with which it is supplied, do not form an intimate bond with the ceramic. Consequently, mechanical deformation of the ceramic material is not firmly coupled to the laminated structure in which the envelope is embedded, and, in the case of a sensor, deformation of the structure is not properly transmitted to the ceramic.

It will be appreciated from the foregoing that there is still a need for improvement in the field of piezoelectric ceramic sensors and actuators as applied to active damping of composite structures. The present invention is directed to this end.

SUMMARY OF THE INVENTION

The present invention resides in a method of forming a piezoelectric sensor or actuator package that is more easily embedded or laminated in a composite structure, such as a laminated graphite structure. Further, the invention provides a sensor or actuator package that may be used to advantage in other types of structures as well.

Briefly, and in general terms, the method of forming an actuator/sensor package includes the steps of bonding wire leads to electrodes of a ceramic actuator/sensor, and encapsulating the ceramic actuator/sensor in a non-conductive fiber composite material having a coefficient of thermal expansion between that of the ceramic material and a graphite-epoxy laminate in which the actuator/sensor may be later embedded. The encapsulating material provides good coupling of mechanical strain, reduces thermally induced stresses, electrically insulates the actuator/sensor, and protects it from mechanical damage.

The presently preferred embodiment of the invention uses a fiberglass cloth and epoxy as the encapsulating material. More specifically, the encapsulating step includes wrapping the ceramic actuator/sensor in the encapsulating material and curing the encapsulated package at a suitable temperature, to harden the encapsulating material. The curing step is performed at a low temperature and preferably under pressure to ensure extraction of unused epoxy resin.

Optionally, the method may also include the step of placing, prior to encapsulation, a high-modulus graphite fiber material next to the actuator/sensor, with fibers extending in a direction transverse to a desired longitudinal direction of strain. The graphite fibers terminate adjacent to, but not in electrical contact with the ceramic, and the actuator/sensor characteristics are enhanced because the graphite material inhibits strain in the transverse direction.

The invention also encompasses an actuator/sensor package fabricated in accordance with the foregoing method steps.

Another aspect of the invention is a method of embedding a ceramic actuator sensor in a laminated structural member, including the steps of bonding wire leads to electrodes of a ceramic actuator/sensor, encapsulating the ceramic actuator/sensor in a non-conductive fiber composite material to form an actuator/sensor package, and embedding the actuator/sensor package at a selected location in the laminated structural member.

More specifically, the embedding step includes placing the actuator/sensor package in its selected location between laminates of the structural member during fabrication of the member, and curing the composite structural member at an elevated temperature. The curing step includes raising the temperature of the laminated structural member relatively rapidly to a curing temperature lower than is normally used in curing the structural member, maintaining the curing temperature for a longer time than is normally used in curing the structural member, and cooling the member slowly to minimize thermal cracking of the embedded ceramic package.

The step of embedment may further include piezoelectrically prestressing the actuator/sensor package by applying a voltage to it during the curing step and slowing removing the voltage during cooldown. A compressive prestress is induced in a lateral direction by the applied voltage, and removal of the voltage results in a lateral expansion that opposes thermal shrinkage and helps reduce thermally induced stresses and cracks in the actuator/sensor package.

It will be appreciated from the foregoing summary that the present invention represents a significant advance in the field of piezoelectric actuators and sensors. In particular, the invention provides an actuator/sensor package that minimizes thermal stress problems, provides electrical insulation and protection from mechanical damage, and also provides good strain coupling to or from a structural member in which it is embedded. Other aspects and advantages of the invention will become apparent from the following more detailed description, taken in conjunction with the accompanying drawings.

BRIEF DESCRIPTION OF THE DRAWINGS

FIG. 1 is a simplified perspective view of a ceramic actuator or sensor;

FIG. 2 is a simplified cross-sectional view of a ceramic actuator or sensor after encapsulation in accordance with the invention;

FIG. 3 is a simplified plan view of a group of three ceramic actuators or sensors after encapsulation in accordance with the invention;

FIG. 4 is a simplified view of an encapsulated ceramic actuator or sensor after embedment in a laminated graphite structure;

FIG. 5 is a diagrammatic view of a ceramic actuator or sensor to illustrate a prestressing feature of the invention; and FIG. 6 is a graph showing a preferred curing and cooldown cycle for embedment of the encapsulated actuator or sensor.

DESCRIPTION OF THE PREFERRED EMBODIMENT

As shown in the drawings for purposes of illustration, the present invention is concerned with a technique for fabricating a ceramic actuator or sensor package, which facilitate embedment in a laminated structural member. The principal difficulties of embedding ceramic devices in laminated structures, such as laminated graphite members, are: (1) a large difference in the coefficients of thermal expansion (CTE) of ceramics and graphite laminates, (2) providing insulation for electrodes and leads to the ceramic devices when embedded in a conductive material, and (3) the inherent fragility of the ceramic materials.

In accordance with the invention, a ceramic actuator or sensor is completely encapsulated in a non-conductive fiber composite material prior to embedment in a structural member. The encapsulating material may be conveniently chosen to provide a coefficient of thermal expansion (CTE) that is between the CTE of the ceramic material and the CTE of graphite-epoxy laminates of the structure in which the device is to be embedded. Moreover, the encapsulating material provides a desirably firm mechanical coupling between the device and the structure in which it is to be embedded, and protects the device from potential damage from handling prior to and during installation.

FIG. 1 shows a piezoelectric ceramic actuator, indicated by reference numeral 10. Wherever the term "actuator" is used in this description, it will be understood that the device 10 may also be a piezoelectric sensor. The actuator 10 has two parallel electroplated faces 12, 14, which are the device electrodes. When a voltage is applied to the electrodes, an electric field is set up in a direction perpendicular to the faces 12, 14, which is referred to as the poling direction. The electric field causes strain or deformation in this direction.

The first step in the process of fabricating an actuator package is bonding wire leads, shown at 16, 18, to the electroplated faces 12, 14. Any of several methods may be used, such as adhesive bonding with an epoxy that cures at room temperature, or a carefully selected soldering process. The solder employed must have a melting point greater than 350° F., the curing temperature of graphite epoxy material, but less than the Curie temperature of the ceramic material, above which the piezoelectric properties of the device will be lost. The presently preferred approach is to spot bond the leads 16, 18 near the ends of the device 10, and thereby hold the leads in place during subsequent encapsulation. After encapsulation, which is preferably performed under pressure, the leads are held in intimate contact with the electroplated faces 12, 14 by the encapsulating material.

Those portions of the leads 16, 18 not in direct contact with the electroplated faces 12, 14 are coated with an insulating material, such as KAPTON. Preferably, the leads 16, 18 have a flat or ribbon-shaped cross-section, to ensure better contact with the electroplated faces 12, 14, at least for those portions of the leads that are in contact with the device faces. The flat lead surface produces lower contact stress on the device 10, and leaves a lower protrusion for the subsequent encapsulation step. The use of a ribbon wire, therefore, effectively eliminates cracking of the ceramic material.

The next step in the fabrication process is encapsulation of the ceramic actuator 10 in a non-conductive fiber composite material, such as a fiberglass cloth and a two-part room-temperature epoxy, e.g. EPON 828, manufactured by Shell Oil Company. The device 10 and the encapsulating material, indicated at 20, are cured as a unit at a low temperature, typically room temperature. The procedure can be performed in a vacuum bag (not shown), to enable the extraction of unused resin and to produce a thin, flat actuator package 22, as shown in FIG. 2. The vacuum bag makes use of external atmospheric pressure to compress the package and extract unwanted air and excess resin. Use of the vacuum bag also ensures good contact with the device electrodes.

An alternate encapsulating material 20 is a pre-impregnated fiberglass or KEVLAR (manufactured by DuPont) cloth having a low temperature curing epoxy resin, preferably less than 250°. The resin content of the insulating cloth should be high, greater than 50% by weight. A high resin content forms an epoxy matrix that coats the fibers and fills in gaps in the fabric weave that would otherwise form pinholes in the package. A high resin content is also desirable to provide desired mechanical properties, such as a relatively high CTE, which can be controlled to some degree by the specific resin content used.

The actuator package 22 formed as described has a number of important advantages over other available techniques. First, the fiberglass material 20 provides a layer of intermediate CTE value and thereby reduces stresses induced during fabrication or use of the devices. Second, the fiberglass covering for the package provides an ideal mechanical coupling between the piezoelectric ceramic device 10 and the structure in which it is embedded. In previous attempts to embed actuators in structural members, the material used to wrap the actuators provided only a relatively loose mechanical coupling. Third, the fiberglass material provides complete electrical insulation between the ceramic device and the material in which it is embedded. In addition, the strong fiberglass package is easy to handle without damage, and may even be applied to curved structures.

A further advantage of the fiberglass package is that its piezoelectric strain properties can be enhanced by a simple modification to the package. An ultra high modulus graphite fiber material may be placed next to the actuator prior to encapsulation in the fiberglass material. The graphite fibers are laid in a direction transverse to the desired direction of longitudinal strain. The graphite fibers terminate near the lateral edges of the actuator 10, but without electrically contacting the device. When a voltage is applied to the actuator 10, a strain is induced principally in the desired longitudinal direction, but also in a transverse or lateral direction. This lateral strain is inhibited by the presence of the graphite fibers, and as a result, the amount of longitudinal strain is increased. It is believed that the amount of additional voltage-induced longitudinal strain is nearly proportional to the Poisson ratio of the ceramic.

The actuator package can be employed in a variety of ways, not all of which require its embedment in a structural member. When the package is used as a sensor, it may be bonded to an exterior surface of a member. However, the actuator package of the invention achieves its principal advantages when embedded in a composite structure, such as a laminated graphite-epoxy structure. Basically the step of embedment of the actuator package includes placing the package in the laminated structure and curing the composite structure at an appropriate elevated temperature. FIG. 4 shows the placement of an actuator package in a graphite epoxy structural member 40 formed on a mandrel 42. Curing is best performed at a temperature somewhat lower, and for a time somewhat longer, than the typical cure temperature for graphite epoxy laminates. For example, a fiber resin system designated T300/934 can be cured at 280° F. for four hours, instead of the normal two-hour cure at 350° F. By curing at a lower temperature but holding the temperature longer, the strength and stiffness properties of the laminate are largely preserved, but without such a large buildup of internal thermal stresses due to the CTE mismatch.

FIG. 6 depicts a typical cure cycle for the embedment step, showing a relatively rapid heating phase from room temperature to 280° F., a slow cure of about four hours, and a slow cooldown phase of approximately twelve hours, to minimize thermal stress problems. The slow cooldown is effected by simply turning off the oven or autoclave in which curing is performed.

Although the actuator package of the invention is effective in reducing thermal stresses caused by a CTE mismatch, and stresses are further reduced by a reduced-temperature cure, thermal stresses may be even further reduced by piezoelectric prestressing, to which the invention lends itself. If a positive voltage is applied in the poling direction of the device 10 during cure cycle, the ceramic will expand in the poling direction and shrink laterally, as indicated by the outline 10' in FIG. 5. During cooldown, there is a tendency for the ceramic to shrink laterally, but this will be opposed by the tendency of the ceramic to expand laterally as the voltage is slowly removed during the cooldown phase, causing a resultant compressive prestress in the lateral direction, and reducing the occurrence of thermally induced stress cracks in the ceramic.

It will be appreciated from the foregoing that the present invention represents a significant advance in the field of deformation actuators and sensors. In particular, the invention provides for encapsulation of a sensor in a fiberglass material, which reduces CTE mismatch problems when embedding the actuator in a composite structure, provides complete electrical insulation, and minimizes actuator damage during handling and installation.

It will also be appreciated that, although an embodiment of the invention has been described in detail for purposes of illustration, various modifications may be made without departing from the spirit and scope of the invention. Accordingly, the invention is not to be limited except as by the appended claims.

We claim:

1. An actuator/sensor package highly suited for installation by embedding in a graphite-epoxy laminate structure, the actuator/sensor package being made by a process including the steps of:

bonding wire leads to electrodes of a ceramic actuator/sensor; and encapsulating the ceramic actuator/sensor in a nonconductive fiber composite material having a coefficient of thermal expansion (CTE) between the CTE of the ceramic material and the CTE of a selected graphite-epoxy laminate structure;

whereby the encapsulating material provides good mechanical coupling, reduces thermally induced stresses, electrically insulates the actuator sensor, and protects it from mechanical damage.

2. An actuator/sensor package as defined in claim 1, wherein:

the encapsulating material is a fiberglass cloth and epoxy resin.

3. An actuator/sensor package as defined in claim 2, wherein the encapsulating step includes:

wrapping the ceramic actuator/sensor in the encapsulating material; and curing the encapsulated package at a suitable temperature, to harden the encapsulating material.

4. An actuator/sensor package as defined in claim 3, wherein:

the curing step is performed at a low temperature and under pressure to ensure extraction of excess epoxy resin.

5. An actuator/sensor package as defined in claim 1, wherein:

the encapsulating material is KEVLAR impregnated with epoxy.

6. An actuator/sensor package as defined in claim 5, wherein the encapsulating step includes:

wrapping the ceramic actuator/sensor in the encapsulating material; and curing the encapsulated package at a suitable temperature, to harden the encapsulating material.

7. In an actuator-sensor device formed of a fracturable ceramic material capable of performing piezoelectric functions and which is sensitive to heat and pressure conditions, said actuator-sensor being highly suited for installation by embedding in graphite-epoxy laminated structures under conditions of heat and pressure, said device comprising:

a thin ceramic substrate having a coefficient of thermal expansion with electrodes thereon to which are bonded wire leads; and envelope means encapsulating said substrate in a non-conductive fiber composite material having a coefficient of thermal expansion that is between that of the ceramic substrate and a selected graphite-epoxy laminated structure, and having a thickness that reduces thermally induced stress to said substrate and electrically insulates the substrate and protects said sensor from being fractured when subjected to pressure.

8. An actuator/sensor package highly suited for installation by embedding in a graphite-epoxy laminate structure, the actuator/sensor package being made by a process including the steps of:

bonding wire leads to electrodes of a ceramic actuator/sensor;

placing a high-modulus graphite fiber material next to the actuator/sensor, with fibers extending in a direction transverse to a desired longitudinal direction of strain, and terminating adjacent to, but not in electrical contact with the ceramic, wherein the actuator/sensor characteristics are enhanced because the graphite material inhibits strain in the transverse direction; and encapsulating the ceramic actuator/sensor, including the high-modulus graphite fibers, in a non-conductive fiber composite material having a coefficient of thermal expansion (CTE) between the CTE of the ceramic material and the CTE of a selected graphite-epoxy laminate structure;

whereby the encapsulating material provides good mechanical coupling, reduces thermally induced stresses, electrically insulates the actuator sensor, and protects it from mechanical damage.

9. An actuator/sensor package highly suited for installation by embedding in a graphite-epoxy laminate structure, the actuator/sensor package comprising:

a ceramic actuator/sensor having a pair of electrodes and wire leads bonded to the electrodes;

a layer of high-modulus graphite fiber material placed next to the actuator/sensor, with fibers extending in a direction transverse to a desired longitudinal direction of strain, and terminating adjacent to, but not in electrical contact with the ceramic, wherein the actuator/sensor characteristics are enhanced because the graphite material inhibits strain in the transverse direction; and an encapsulating material surrounding the ceramic actuator/sensor, including the high-modulus graphite fibers, in a non-conductive fiber composite material having a coefficient of thermal expansion (CTE) between the CTE of the ceramic material and the CTE of a selected graphite-epoxy laminate structure;

whereby the encapsulating material provides good mechanical coupling, reduces thermally induced stresses, electrically insulates the actuator sensor, and protects it from mechanical damage.

\* \* \* \* \*